United States Patent

Fields

[15] 3,644,792

[45] Feb. 22, 1972

[54] REUSABLE CIRCUIT BOARD FOR CONSTRUCTING LOGIC CIRCUITS USING INTEGRATED CIRCUIT ELEMENTS

[72] Inventor: John H. Fields, Phoenix, Ark.

[73] Assignee: Honeywell Information Systems Inc., Ariz.

[22] Filed: July 2, 1970

[21] Appl. No.: 51,873

[52] U.S. Cl. .......................... 317/101 CC, 29/626, 174/68.5, 339/17 C

[51] Int. Cl. .......................................... H05k 1/18, H05k 3/32

[58] Field of Search .............. 174/DIG. 3, 68.5; 317/101 CC, 317/101 CP; 339/17 C, 17 CF, 276 A; 29/626; 324/158 F

[56] References Cited

OTHER PUBLICATIONS

" High-Density Dual- in- Line Packaging Panels," Catalog No. 266 appearing between pages 112- 113 of Electronic Design, Aug. 2, 1967, Vol. 15, No. 16 (6 pages)

*Primary Examiner*—Darrell L. Clay
*Attorney*—Edward W. Hughes, James A. Pershon, Frank L. Neuhauser, Oscar B. Waddell and Joseph B. Forman

[57] ABSTRACT

The device disclosed utilizes a circuit board having pin connectors mounted thereon for use in combination with an integrated circuit package and a demountable solderless connector for mounting the package on the board. The combination, depending upon the electrical connections to the pin connectors, allows various types of logic structures to be designed and laid out many times over without degrading or damaging the circuit board or the electronic elements.

6 Claims, 3 Drawing Figures

INVENTOR.
JOHN H. FIELDS

REUSABLE CIRCUIT BOARD FOR CONSTRUCTING LOGIC CIRCUITS USING INTEGRATED CIRCUIT ELEMENTS

BACKGROUND OF THE INVENTION

The present invention relates generally to circuit boards and more particularly to a device which allows logic structures and circuits to be built up on a circuit board using multi-lead electronic elements, such as integrated circuit packages.

1. Field of the Invention

In the field of electronic circuit design it is customary to design and build what is commonly referred to as a "prototype" or "breadboard" circuit. This custom is particularly true in the case of printed circuit board designs utilizing integrated circuits due to the difficulties and expense of making changes or corrections to the circuitry once the board has been fabricated. As such, it is desirable to provide a device for the economical design and construction of prototype circuits to prove the operation of the circuits prior to their fabrication into a final printed circuit board. It is also desirable that the device be constructed such that multilead electronic components and wire connections can be readily changed on the device while the circuit is in its design stages.

2. Description of the Prior Art

For a clear understanding of the terminology employed throughout this specification a circuit board is defined as a substrate of insulative material having a planar surface including means for mounting and electrically interconnecting electrical and electronic components or elements.

Circuit board design engineers have always been faced with the problem of being able to make wire and component changes to circuits on prototype or special purpose circuit boards without damaging or destroying the circuit board or the components mounted thereon.

In the prior art, several approaches have been used to provide a properly designed reusable circuit board for special purpose and prototype circuit designs. One such approach utilizes a circuit board having a plurality of holes formed therein. The connecting leads of integrated circuit packages or the like are inserted into the holes and soldered to a conductive material surrounding the holes on the side of the board opposite the circuit packages. Wires, which are used to interconnect the various connecting leads of the circuit packages, are also soldered to the conductive material. The circuit board is also provided with a printed circuit connector on one end thereof so that the board may be plugged into a suitable receptacle during test or operation of the circuit.

Another approach employed in the prior art uses a circuit board somewhat similar to that just described. However, instead of soldering the connecting leads of the circuit packages directly to the circuit board conductive material, integrated circuit package connectors are used. Leads of the circuit package connectors are soldered to the board in the same manner as described for the circuit packages and all point-to-point wiring is done on the leads of the connectors. The connecting leads of the circuit packages are then inserted into spring tension receptacles of the integrated circuit connectors.

There are a number of problems not solved by the previously described approaches. One of these problems is that the interconnecting wires must be soldered to printed wire connecting points on the side of the board opposite the components. This has the disadvantage of requiring the unsoldering of a wire whenever a change is to be made to the circuit wiring. Further, due to the small size of the connecting points, it is difficult to connect more than one wire to a given point. Also, continuous heating of the printed circuit connecting points can damage the integrated circuits and cause the etched printed circuit conductor to separate from the circuit board. As a result, the board and circuit packages are eventually destroyed and must be replaced.

Another disadvantage of the previously described prior art is the overall thickness of the circuit board. This thickness takes into consideration the thickness of the substrate and the thickness of the circuit packages. In addition the integrated circuit connector leads protruding from the substrate and the wires which are utilized to interconnect the integrated circuits add to the thickness of the circuit board. The thickness of the board becomes a predominant consideration in many applications. For example, in the computer industry, circuit boards are packaged close together in equipment cabinets to provide density and to reduce the overall size of the cabinets. It is not uncommon to vertically mount circuit boards on ½-inch centers, and to do so requires that the components, wires, etc., on the boards not touch adjacent boards.

SUMMARY OF THE INVENTION

The device of the present invention alleviates these problems of the prior art by providing a universal reusable circuit board for designing logic structures and electronic circuits. The circuit board is adapted to plug into a suitable electrical receptacle to provide electrical potentials and signals so that the circuits on the board can be operated or tested. Further included on the circuit board is a plurality of pins, some of which are used in combination with demountable solderless connectors for electrically connecting and mounting integrated circuit packages on the circuit board. Other pins serve to facilitate the removable interconnection of wires among the pins of the circuit board to design the circuits.

The circuit board of the present invention provides the capability of designing logic structures or circuits for prototype design of limited usage which more closely approximates a finished printed circuit board design than prior art circuit boards. Also the present invention eliminates the requirement of making solder connections on the circuit board, thus allowing the circuit board and associated components to be used many times over.

It is, therefore, an object of the present invention to provide a device for the designing of logic structures using multilead electronic elements;

It is a further object to provide a circuit board including a plurality of pins in combination with an integrated circuit and a connector for designing logic structures;

A still further object is to provide a circuit board having all components and wiring mounted on one side thereof;

A further object is to provide a circuit board having pins, some of which are used for making wiring connections and others for removably mounting an integrated circuit assembly;

It is still a further object to provide a circuit board having a plurality of sets of pins for electrically connecting conductive leads of an integrated circuit assembly to a selected set and for selectively interconnecting wires among the pins of another set.

It is yet a further object to provide a circuit board having contact means for establishing electrical connections between the circuit board and external electrical potentials and signals and including a plurality of sets of pins, one set for electrically connecting conductive leads of an integrated circuit assembly to a second set and further including wires selectively interconnecting the second set and the contact means.

The foregoing and other objects will become apparent as this description proceeds and the features of novelty which characterize the invention will be pointed out in particularity in the claims annexed to and forming a part of this specification.

BRIEF DESCRIPTION OF THE DRAWING

The present invention may be more readily described and understood by reference to the accompanying drawing in which.

DESCRIPTION OF THE PREFERRED EMBODIMENT

Figures 1, 2, 3:
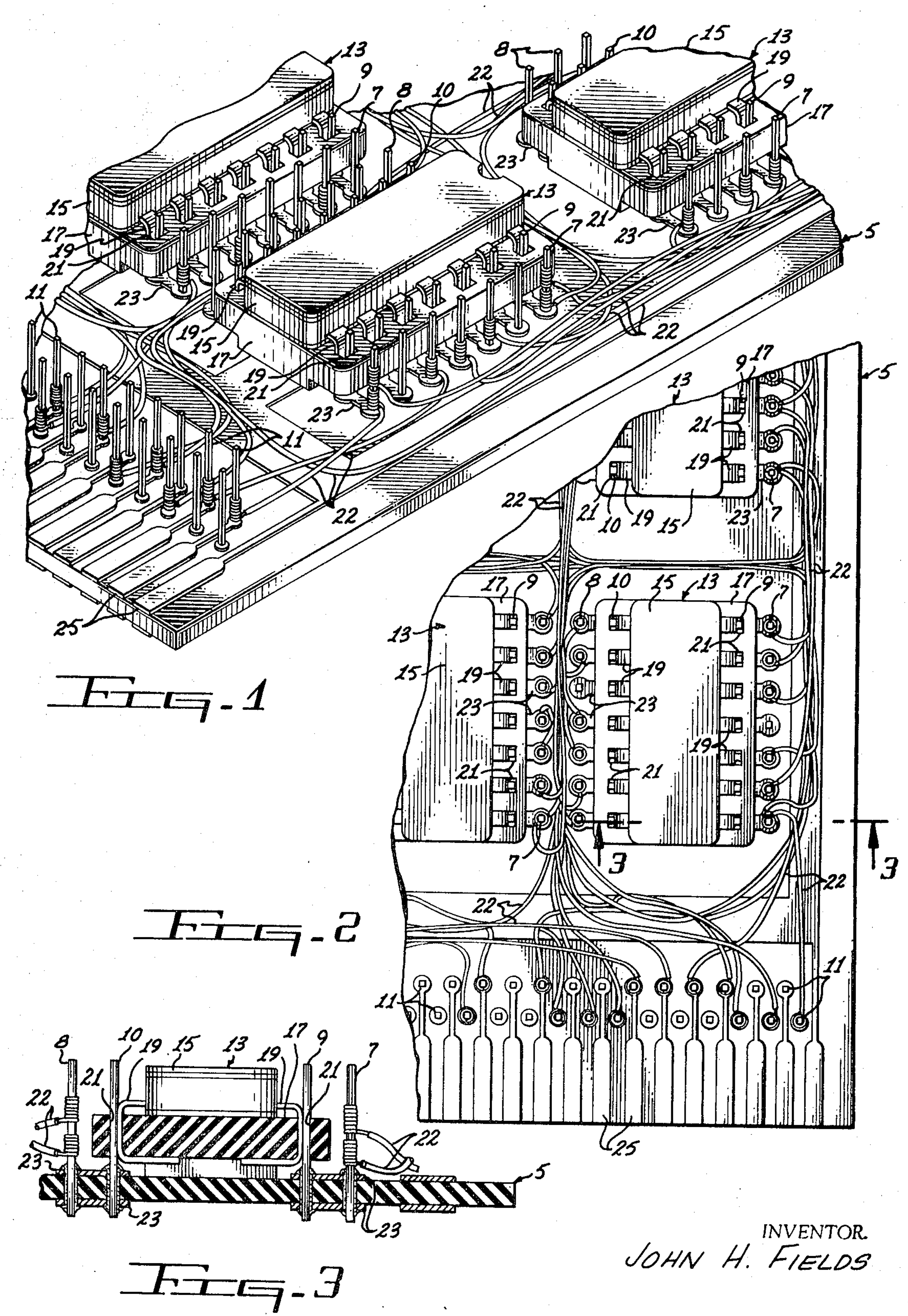
FIG. 1 is an isometric view of a fragmentary portion of a circuit board of the present invention.
FIG. 2 is a top view of the printed circuit board of FIG. 1.
FIG. 3 is an enlarged fragmentary section view taken on the line 3—3 of FIG. 2.

FIG. 1 is an isometric drawing of a circuit board 5 of the preferred embodiment which is fabricated preferably from a sheet of insulative material. Included as a part of board 5 are a plurality of connecting pins 7 and 8, mounting pins 9 and 10, and terminating pins 11 rigidly mounted in a vertical position on the planar surface of the board. The connecting pins are arranged into a first set of two rows, a first row of connecting pins 7 and a second row of connecting pins 8. In a similar fashion the mounting pins are juxtapositionally arranged inside connecting pins 7 and 8 into a second set, a third row of mounting pins 9 and a fourth row of mounting pins 10. Connecting pins 7 and 8 and terminating pins 11 serve as connecting terminals for conductors or wires 22. In FIG. 1 the conductors 22 are shown connected to pins 7, 8 and 11 by the well-known method of wrapping the wire around the pins; however, any suitable means for connecting the conductors to the pins may be used. An example for purely experimental use is to use a wire with clips on each end as the conductors 22 to selectively fasten the conductors to the correct pins. The clips provide for the easy removal of the conductors when it is necessary to make circuitry changes during experimentation.

Mounting pins 9 and 10 are utilized for the mounting or installation of a circuit or component assembly 13 on the circuit board 5. The circuit assembly 13 is comprises of an integrated circuit package 15 and an integrated circuit connector 17. Preferably at the time of manufacture, the circuit package 15 is positioned on top of the circuit connector 17 such that a plurality of conductive leads 19 of the circuit package extend through corresponding ones of a plurality of apertures 21 in the circuit connector. The portions of the leads 19 extending through the apertures 21 are bent inwardly toward the bottom center of the circuit connector 17 to firmly assemble the circuit package 15 and circuit connector 17 into circuit assembly 13.

As shown in FIGS. 1, 2 and 3, circuit assembly 13 is mounted on the circuit board 5 by positioning the apertures 21 over corresponding mounting pins 9 and 10 and pressing the assembly toward the circuit board 5. With the circuit assembly 13 in place on the circuit board, a tight electrical connection is established within each of the apertures 21 between the adjacent surfaces of the corresponding conductive leads 19 and mounting pins 9 and 10.

The integrated circuit connector 17, illustrated in the present embodiment, is preferably of the type disclosed in U.S. Pat. No. 3,605,062, issued to William G. Tinkelenberg, et al., entitled, "A Connector and Handling Device for Multilead Electronic Elements," and assigned to the same assignee as the present invention.

As shown in FIGS. 1 and 3 in particular, a suitable connecting means or conductors 23, such as an etched printed circuit conductor, is utilized to connect individual ones of the connecting pins 7 and 8 to corresponding ones of the mounting pins 9 and 10 respectively. Thus, each lead of the plurality of conductive leads 19 of the circuit package 15 establishes electrical contact with corresponding ones of the connecting pins 7 and 8 via conductors 23.

Referring again to the terminating pins 11 (FIGS. 1, 2 and 3), it is shown that the terminating pins 11 are individually electrically connected to an associated one of a plurality of etched conductive layers 25 on one end of the circuit board. The conductive layers 25 provide a suitably arranged contact means for plugging the board 5 into a properly adapted receptacle during operation or testing of the circuit previously wired on the board.

The receptacle is utilized in conjunction with the conductive layers 25 and terminating pins 11 to provide the necessary connection of electrical potentials and signals required for the operation and testing of the integrated circuit packages 15 on the circuit board 5. The electrical potentials and signals are selectively distributed from and to the integrated circuits via the terminating pins 11, the conductors 22 and the connecting pins 7 and 8. Interconnections necessary for the integrated circuit packages 15 are also provided via conductors 22 and connecting pins 7 and 8.

For exemplary purposes, FIG. 1 and 2 show the interconnection among connecting pins 7 and 8 and terminating pins 11 by the utilization of conductors 22 which are wrapped around the pins. FIG. 3 illustrates the connecting pins 7 and 8 as each having two conductors 22 connected thereto, exemplifying that a plurality of conductors may easily be connected to any of the pins 7, 8 and 11. This is a desirable feature in the present invention since it allows the easy connection of more than one conductor to a single pin.

It can be readily seen in the drawing that all wiring is accomplished on the component or integrated circuit mounting side of the circuit board, thus facilitating circuit layout and the dressing of wires on the board. This facilitation makes it possible for the circuit design engineer to optimally lay out a circuit or logic structure on the board to such an extent that the lengths and the routing of conductors 22 are relatively close to what is required in a final printed circuit board design, thus simplifying the final design work required to prepare a finished printed circuit board.

While the principles of the invention have now been made clear in a preferred embodiment, there will be immediately obvious to those skilled in the art many modifications of structure, arrangement, proportions, the elements, materials and components used in the practice of the invention and otherwise which are particularly adapted for specific environments and operating requirements without departing from those principles. The appended claims are, therefore, intended to cover and embrace any such modifications within the limits only of the true scope of the invention.

I claim:

1. A reusable circuit board for designing logic structures utilizing integrated circuits comprising, in combination:

an insulative material having a planar surface;

first and second sets of pins vertically mounted on said planar surface;

connecting means on said planar surface interconnecting selected ones of the pins of said first set to selected ones of the pins of said second set;

a removable component assembly including a connector having a plurality of apertures formed therein and a multilead integrated circuit package mounted on said connector, each of said apertures receiving a lead from said circuit package and one pin of said first set of pins to form an electrical connection therebetween; and a plurality of conductors wrapped to selected pins of said second set of pins to apply electrical signals and electrical potentials to said integrated circuit package for designing a logic structure.

2. A reusable circuit board for designing electronic circuits comprising, in combination:

an insulative material having a planar surface;

a plurality of first pins vertically mounted on said planar surface;

a plurality of second pins equal in number to the number of said first pins vertically mounted on said planar surface adjacent said first pins;

a plurality of third pins vertically mounted on said planar surface;

a plurality of contact means for receiving external electrical signals and potentials, said contact means formed on said planar surface and connected to said plurality of third pins;

means electrically connecting individual ones of said first pins to corresponding ones of said second pins;

a multilead integrated circuit package;

an integrated circuit connector having a plurality of apertures formed therein, each of said apertures receiving a lead of said integrated circuit package and one of said first pins to form an electrical connection therebetween; and electrical conductors selectively wrap connected to and interconnecting said plurality of second pins, electrical conductors selectively wrap connected to and between said second pins and said third pins to apply the electrical signals and electrical potentials to said multilead integrated circuit package to form an electronic circuit, all of said conductors lying below the upper extremities of said first, second, and third pins.

3. The circuit board of claim 2 in which a portion of the leads of said multilead integrated circuit package extending through said apertures are bent around said integrated circuit connector to join said package and said connector to form a removable assembly.

4. A reusable circuit board for designing electronic circuits comprising, in combination:

an insulative material having oppositely disposed sides;

first, second and third sets of pins mounted on one of said sides, said third set of pins connected to external electrical signals and electrical potentials;

means electrically connecting individual ones of the pins of said first set to corresponding ones of the pins of said second set;

a removable assembly mounting and electrically connecting a multilead integrated circuit package to said first set of pins, said assembly including the multilead integrated circuit package and a connector having apertures formed therein equal in number to the number of connecting pins in said first set, each of said apertures receiving a lead from said circuit package and a pin of said first set to form an electrical connection therebetween; and electrical conductors selectively wrap connected to and interconnecting said second set of pins, electrical conductors selectively wrap connected to and connecting said third set of pins to said second set of pins to apply the electrical signals and the electrical potentials to said multilead integrated circuit package to form an electronic circuit, all of said conductors lying below the upper extremities of said removable assembly and said first, second and third sets of pins.

5. A circuit board as recited in claim 4 wherein said first set of pins is aligned into first and second rows and said second set of pins is juxtapositionally aligned with said first and second rows into third and fourth rows, said third and fourth rows positioned between said first and second rows.

6. The circuit board of claim 4 in which a portion of the leads of said multilead integrated circuit package extending through said apertures are bent around said integrated circuit connector to form said removable assembly.

* * * * *